United States Patent
Kief et al.

(10) Patent No.: US 8,405,931 B2
(45) Date of Patent: Mar. 26, 2013

(54) MAGNETIC MAIN WRITE POLE

(75) Inventors: Mark T. Kief, Lakeville, MN (US); Kaizhong Gao, Eden Prairie, MN (US); Venkateswara Rao Inturi, Shakopee, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 944 days.

(21) Appl. No.: 12/491,898

(22) Filed: Jun. 25, 2009

(65) Prior Publication Data

US 2010/0328817 A1 Dec. 30, 2010

(51) Int. Cl.
*G11B 5/147* (2006.01)

(52) U.S. Cl. ..................................... 360/125.1

(58) Field of Classification Search .............. 360/125.1
See application file for complete search history.

(56) References Cited

U.S. PATENT DOCUMENTS

| | | | |
|---|---|---|---|
| 6,259,583 B1 * | 7/2001 | Fontana et al. | 360/125.5 |
| 6,342,311 B1 | 1/2002 | Inturi et al. | |
| 6,521,335 B1 | 2/2003 | Amin et al. | |
| 6,693,768 B1 | 2/2004 | Crue et al. | |
| 6,809,899 B1 | 10/2004 | Chen et al. | |
| 6,949,833 B2 | 9/2005 | O'Kane et al. | |
| 7,086,138 B2 | 8/2006 | Anderson | |
| 7,100,266 B2 | 9/2006 | Plumer et al. | |
| 7,177,117 B1 * | 2/2007 | Jiang et al. | 360/125.12 |
| 7,193,825 B2 | 3/2007 | Darmann et al. | |
| 7,464,457 B2 * | 12/2008 | Le et al. | 29/603.16 |
| 7,522,377 B1 * | 4/2009 | Jiang et al. | 360/125.12 |
| 7,609,478 B2 * | 10/2009 | Han et al. | 360/125.12 |
| 7,633,713 B2 * | 12/2009 | Chen et al. | 360/125.12 |
| 7,712,206 B2 * | 5/2010 | Jiang et al. | 29/603.16 |
| 7,716,812 B2 * | 5/2010 | Kato et al. | 29/603.12 |
| 7,848,055 B2 * | 12/2010 | Yamaguchi et al. | 360/125.11 |
| 8,110,085 B2 * | 2/2012 | Hsiao et al. | 205/119 |
| 2002/0071208 A1 | 6/2002 | Batra et al. | |
| 2003/0016470 A1 | 1/2003 | Minor et al. | |
| 2003/0039064 A1 | 2/2003 | Khizroev et al. | |
| 2003/0076629 A1 | 4/2003 | Minor | |
| 2004/0075927 A1 * | 4/2004 | Gill | 360/55 |
| 2005/0024177 A1 | 2/2005 | Lam | |
| 2006/0044680 A1 | 3/2006 | Liu et al. | |
| 2007/0230044 A1 | 10/2007 | Han et al. | |
| 2008/0186636 A1 | 8/2008 | Amin et al. | |

* cited by examiner

*Primary Examiner* — Mark Blouin
(74) *Attorney, Agent, or Firm* — Hall Estill Attorneys at Law (57) ABSTRACT

A magnetic writer includes a write pole configured such that the easy magnetic axis is parallel to the vertical length direction of the write pole tip and to the ABS of the recording media. The write pole tip can be a multilayer structure comprising alternating magnetic and nonmagnetic layers with a planar orientation substantially perpendicular to the ABS and with magnetic anisotropy parallel to the vertical length direction of the write pole tip. The alternating magnetic and nonmagnetic layers may be formed by electroplating on a conformal seedlayer in a trench, or by static off axis physical vapor deposition.

20 Claims, 7 Drawing Sheets

MAGNETIC MAIN WRITE POLE

SUMMARY

A magnetic writer includes a write pole with a magnetic easy-axis parallel to the downtrack direction (i.e. the write pole length). The easy-axis anisotropy can be achieved by engineering the intrinsic and extrinsic shape anisotropies. One method to accomplish this is to fabricate a multilayer write pole with alternating planar magnetic and nonmagnetic layers parallel to a vertical length dimension of the pole (the write pole length) and perpendicular to the ABS. Magnetic anisotropy (i.e. the easy axis) in each magnetic layer is parallel to the vertical length dimension of the write pole and parallel to the ABS.

The write pole tip may be formed by defining a shape of the write pole tip, and depositing alternating magnetic layers and nonmagnetic layers so that the magnetic layers are oriented substantially parallel to a length dimension and substantially perpendicular to the ABS, with each magnetic layer having an easy axis and magnetization substantially parallel to the length dimension and the ABS.

DETAILED DESCRIPTION

The magnetic orientation for a write pole, in some embodiments, has the remanence parallel to the air bearing surface (ABS) with no perpendicular component of the magnetic field. A number of factors affect magnetic orientation in main write poles. Perhaps a large effect is due to shape anisotropy where the demagnetization energy is minimized in specific magnetic orientations related to the shape of the pole. A prime example of shape anisotropy in pole structures is the confinement of alternating magnetic vectors to each layer in multilayer magnetic structures. Crystalline anisotropy also contributes to magnetization orientation, in that the crystalline anisotropy energy is lowest in specific crystallographic directions in a magnetic material. Stress also contributes to magnetization orientation. The easy axis of magnetization will prefer to orient along the principal directions of tensile stress in a solid with an internal stress field. As another example, the interface anisotropy energy is lowest when magnetization is directed along internal interfaces in structures. Thus, there are a number of ways to control remanent magnetization in write poles.

A remanent state parallel to the vertical length direction can be established by engineering the geometry and material properties to insure a minimum energy state for this vertical orientation. In some embodiments, this is accomplished using a very high moment material such as Fe60Co40 with Ms=2.4 T. There are many factors that contribute to the net energy. These are listed in Table 1 in decreasing order of influence.

| Energy | Contributing Factors |
| --- | --- |
| Demagnetization Energy | Pole Shape, Vertical laminations |
| Crystalline Anisotropy Energy | Growth texture, Local crystal order (e.g. FeCo seedlayer) |
| Residual Stress/ Magnetostriction Energy | Tensile stress along vertical axis for FeCo ($\lambda s > 0$) |
| Interface Anisotropy Energy | Perpendicular interface anisotropy (e.g. Co/Pt layers) |
| Intralayer Exchange Energy | AFM interlayer exchange (e.g. FeCo/Ru/FeCo layers) |
| Interface Exchange Energy | Interface exchange bias (e.g. IrMn, PtMn) |

The net effect depends upon the balancing of the geometry and materials. Roughly these energies are listed in decreasing magnitude. Bulk effects outweigh interface effects which outweigh surface energy effects. Pole shape is a factor in tailoring the vertical remanence proposed herein. In addition to controlling remanence/erasure, maximizing write field enables higher areal densities. For maximum write field, the dilution is minimized with an ultimate target of zero (i.e. Pole Ms=2.4 T). This implies a "single-lamination". This can be accomplished by engineering the material magnetic anisotropies listed above and defining a high aspect ratio pole geometry. Vertical remanence can also be reinforced by the addition of bevel and narrow-gap trailing shield structures.

The embodiments disclosed herein describe laminated write poles with remanent magnetizations parallel to the ABS and also to the vertical length direction of the pole tip. The planar laminations are oriented perpendicular to the ABS, thereby eliminating problems associated with prior art poles in which the planar orientations of the laminations are parallel to the ABS.

Figure 1A:
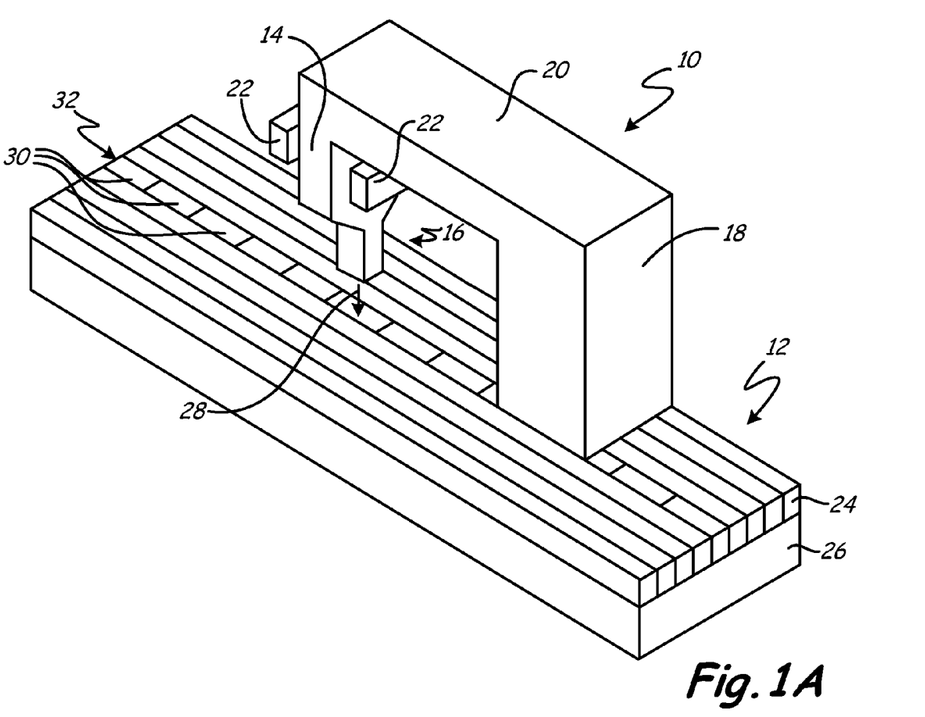
FIG. 1A depicts a perpendicular magnetic recording head, similar to those found in modern disc drives.

FIG. 1A is a perspective view of an example magnetic perpendicular recording head 10 and storage medium 12. Recording head 10 has at least a magnetically permeable main write pole 14, pole tip 16, flux return pole 18, backgap passage 20, and write coil 22. Storage medium 12, which may be in the form of a rotatable disc has at least a_hard magnetic recording layer 24 and soft magnetic underlayer 26.

Write pole 14 is oriented substantially perpendicular to magnetic storage medium 12. Write pole 14 consists of at least a pole tip 16, which is magnetically coupled to flux return pole 18 through back gap passage 20. Return pole 18 has a substantially larger area facing magnetic storage medium 12 than the bottom surface of write pole tip 16. For recording, a magnetic field is induced in write pole 14 by an electrically conducting write coil 22. Write pole 14 is separated from return pole 18 by a nonmagnetic gap and is separated from electrically conducting coil 22 by an insulating layer (not shown). The magnetic field passes through storage medium 12 as indicated by arrow 28 and orients the magnetization of regions 30 in track 32 of hard magnetic recording layer 24 either perpendicularly up or down depending on the direction of the current in write coil 22. After the magnetic field passes through hard magnetic recording layer 24, it passes through soft magnetic underlayer (SUL) 26 before it enters return pole 16 and back gap passage 20 to complete the magnetic write circuit.

Figure 1B:
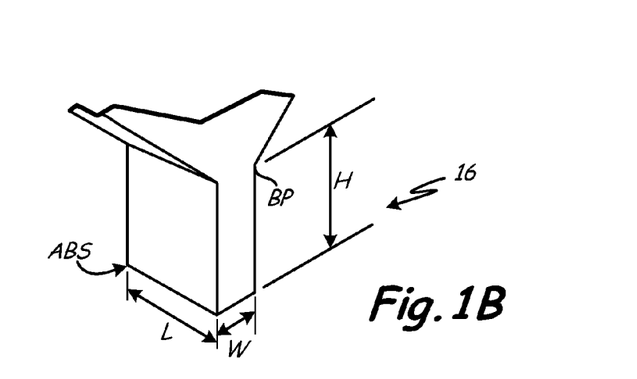
FIG. 1B is a higher magnification view of a write pole tip of the magnetic recording head of FIG. 1A.

FIG. 1B illustrates the dimensions of the example write pole tip 16. Pole tip 16 is defined by short transverse width W, vertical length L, and height H. Length L determines the density of sectors along each track. Length L is also parallel to the "vertical" dimension known to those in the art of read/write head fabrication as the direction of thin film growth. Width W of pole tip 16 at air bearing surface ABS defines the track width of track 32, and is therefore preferably as small as possible. A wider pole tip produces wider tracks, causing fewer to be available on the disc on which to write data. A narrower pole tip reduces the width of tracks 32 and thus is useful to maximize areal density of the disc. A narrower pole tip allows for increased track density as compared to a wider pole tip. Pole height H is defined as the distance between air bearing surface ABS and breakpoint BP wherein pole tip 16 widens into main pole body 14.

When transverse pole width W is considerably less than height H, there is a strong potential for magnetic remanence in pole tip 16 to be perpendicular to the ABS, predominantly due to shape anisotropy. This residual magnetic field out of the ABS plane may cause unintended writing or erasure of data during otherwise normal operation. The potential for perpendicular remanence in main pole 14 increases with the aspect ratio (height/width) of pole tip 16. Various other steps taken to counter the potential for vertical remanence, such as lamination of the main pole parallel to ABS, achieve the operational effect but also have the undesired effect of reducing the strength of the write field due to dilution resulting from the increased volume percentage of nonmagnetic layers. A strong write field precisely targeted to the correct region on the disc is important for performance of the disc drive. As demand grows for smaller pole tips and the resulting increased areal density disc drives, the aspect ratio of pole tip 16 continues to increase. The resulting vertical remanence effects have and will continue to be more problematic.

While pole tip 16 schematically illustrated in FIGS. 1A and 1B has a rectangular shape, many shapes are employed in the art. Trapezoidal and triangular shapes are common and are discussed in what follows.

Figure 2A:
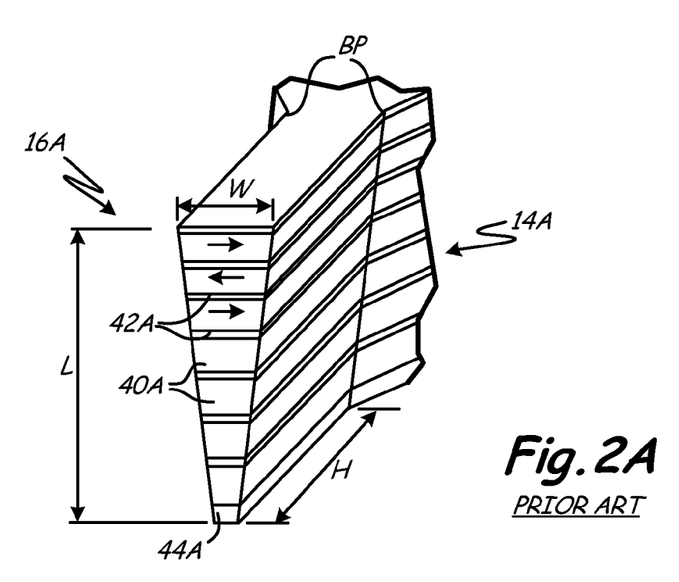
FIG. 2A is a bottom schematic view of a prior art laminated write pole showing easy axis remanence.

FIG. 2A is a bottom (ABS) schematic view showing a laminated pole 14A and pole tip 16A. Pole 14A and pole tip 16A are comprised of alternating magnetic layers 40A, separated by nonmagnetic layers 42A on seed layer 44A. The magnetic easy axis in each lamination is parallel to the short transverse direction of the pole and to the ABS. Increasing the length/width aspect ratio of the pole tip to accommodate higher bit areal densities requires that the layer thickness be correspondingly decreased to maintain the shape anisotropy such that the remanent magnetization is parallel to the ABS. This has the effect of diluting the magnetic write field due to the increased concentration of nonmagnetic spacer layers in pole tip 16A. A weaker write field reduces the speed and accuracy of read/write head 10 when writing data to storage medium 12.

Figure 2B:
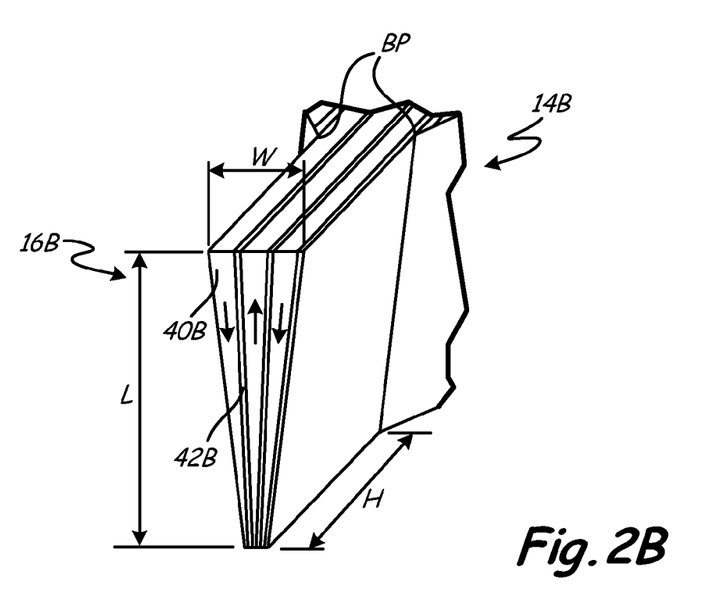
FIG. 2B is a bottom schematic view of a write pole according to one aspect of the present invention showing easy axis remanence parallel to the length direction of the write pole.

The above mentioned issues with excessive magnetic field dilution resulting from excess nonmagnetic material in pole tip 16A of FIG. 2A are overcome by the example pole tip 16B illustrated in FIG. 2B.

FIG. 2B shows a bottom (ABS) schematic view of laminated pole 14B with pole tip 16B. In this case, laminated pole 14B and pole tip 16B comprise at least alternating magnetic layers 40B and nonmagnetic layers 42B oriented such that the planes of layers 40B and 42B are perpendicular to the ABS as well as generally parallel to vertical direction L. In this configuration, shape anisotropy promotes easy axes of magnetic layers 40B parallel to vertical pole length L as shown. Remanent magnetization out of the ABS plane is minimized if not eliminated.

Figure 3:
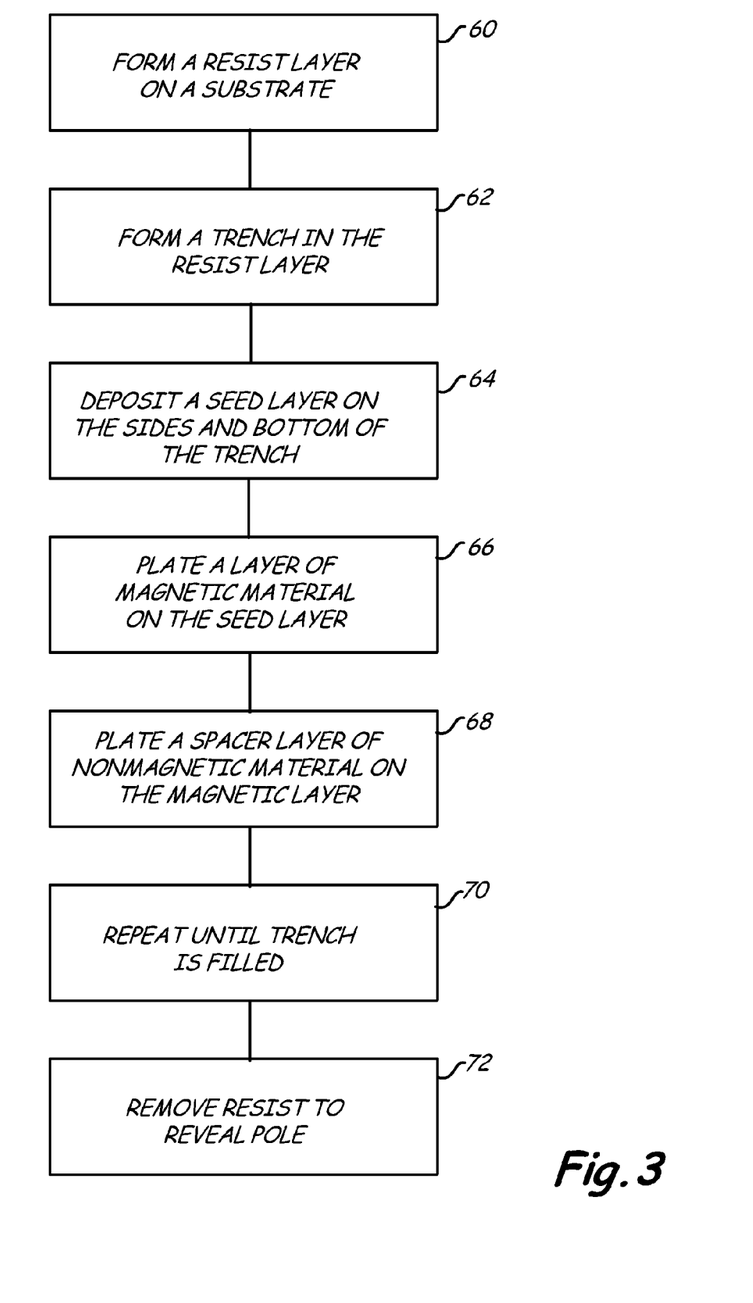
FIG. 3 is a schematic illustrating a method of fabricating one aspect of the invention via electroplating.
Figure 4A:
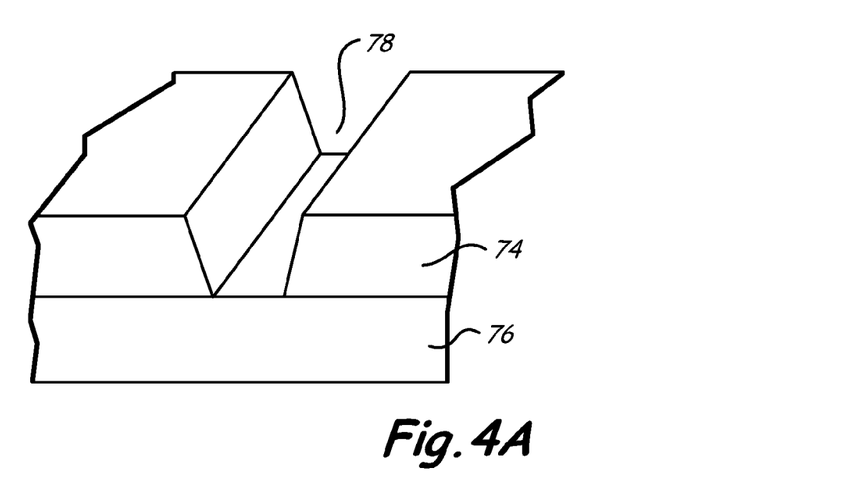
FIG. 4A is a perspective view that schematically depicts a trench in a photoresist layer used to form an electroplated multilayer write pole by damascene plating.
Figure 4B:
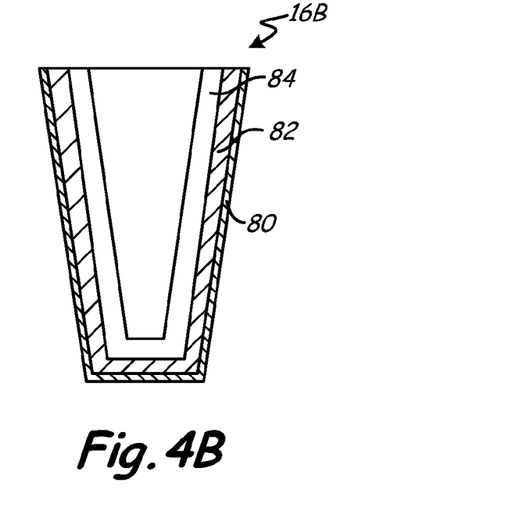
FIG. 4B is a schematic view showing a cross-section of a write pole partially formed by damascene plating.
Figure 4C:
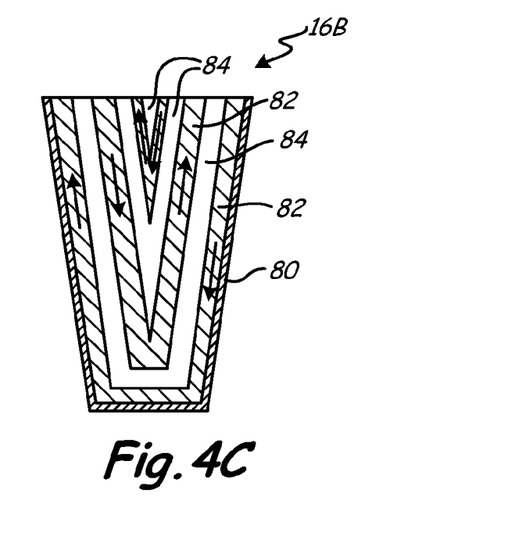
FIG. 4C is a schematic view showing a cross-section of the write pole completely formed by damascene plating.
Figure 5:
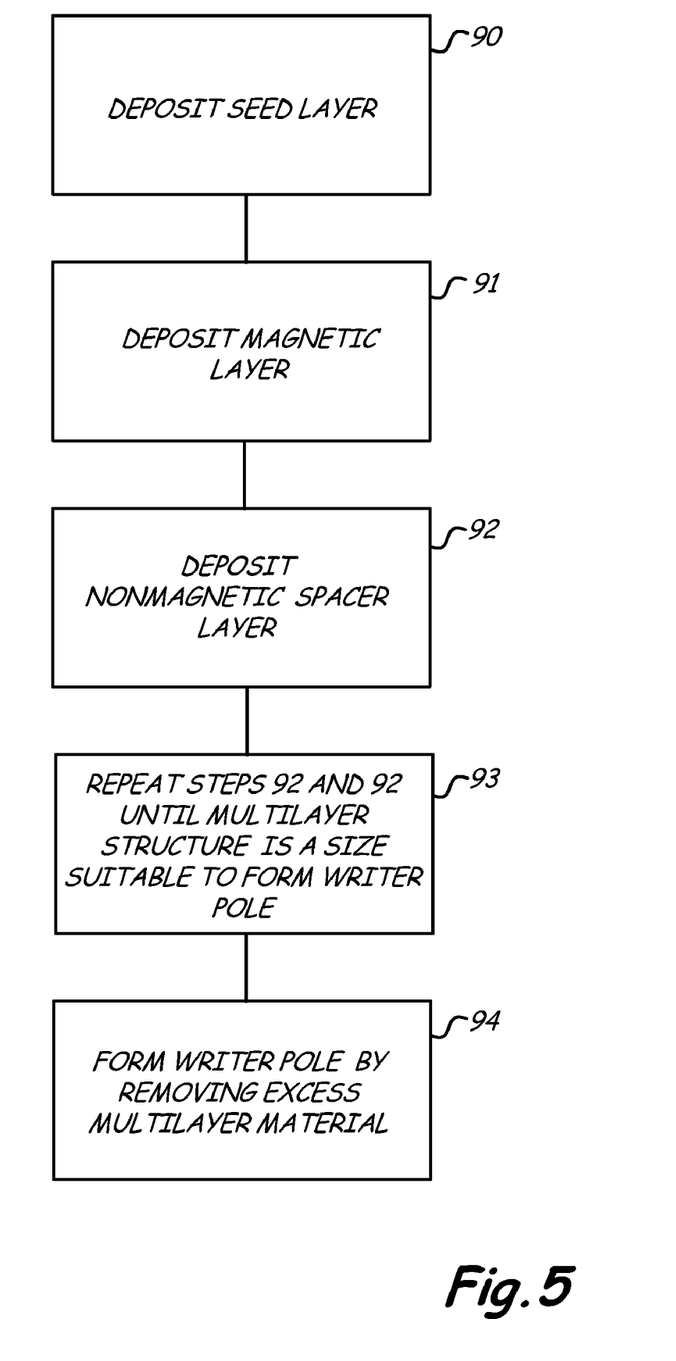
FIG. 5 is a schematic showing the steps necessary to form a write pole from a multilayer structure formed by physical vapor deposition.
Figure 6A:
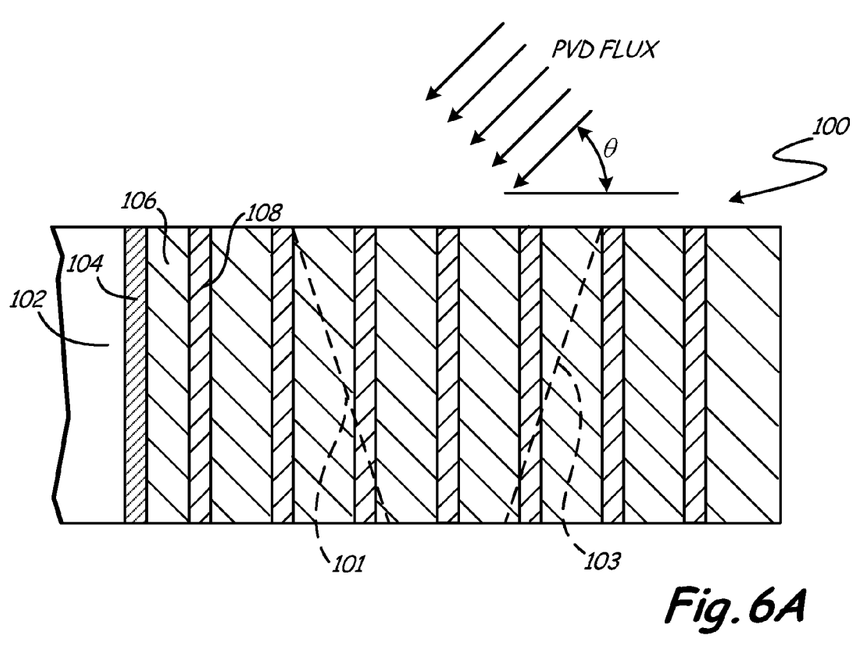
FIG. 6A is a schematic view showing the cross-section of a multilayer structure formed by physical vapor deposition (PVD).
Figure 6B:
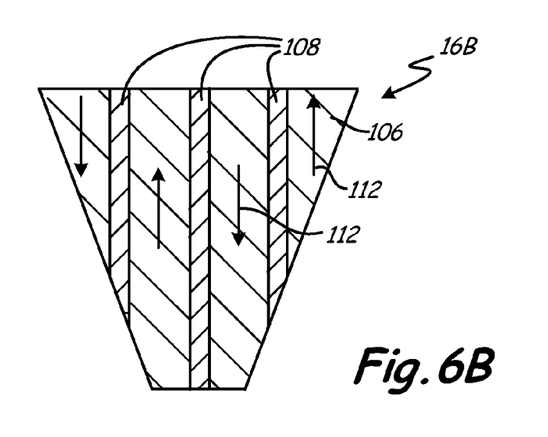
FIG. 6B is a schematic view showing the cross-section of a write pole formed from a multilayer structure.

Two embodiments whereby laminated write pole tip 16B is formed such that the remanent magnetization is parallel to both vertical direction L as well as to the ABS are described in what follows. FIG. 3 schematically describes a method to form one embodiment comprising a laminated pole tip formed by damascene plating, as schematically illustrated in FIGS. 4A-4C. FIG. 5 schematically describes an non-limiting example method to form another embodiment comprising a laminated pole tip formed by physical vapor deposition, as schematically illustrated in FIGS. 6A and 6B. In both embodiments, the pole tip width dimension W is typically less than 120 nm.

To form the damascene pole structure, as described in FIG. 3 and schematically illustrated in FIGS. 4A-4C, resist layer 74 is first formed on substrate 76 (step 60). Next, trench 78 is formed in resist layer 74 (step 62). Trench 78 can be formed using photolithographic methods (e.g., coating, soft bake, exposure, development, hard bake, etc.), ion beam milling or other material removal techniques. Seedlayer 80 is then deposited on the sides and bottom of trench 78 (step 64). Seedlayer 80 is electrically conducting, in some embodiments, if subsequent layers are deposited by electroplating. Seedlayer 80 controls the quality of the subsequent layers to be deposited in the trench and can be deposited by plating, sputtering or other material deposition techniques. Next, first magnetic layer 82 is deposited on seedlayer 80 by plating (step 66). Magnetic layer 82 can be deposited by electroplating or electroless plating. Preferably magnetic layer 82 is formed of cobalt iron (CoFe), cobalt nickel iron (CoNiFe), nickel iron (NiFe), cobalt (Co) or similar ferromagnetic material. A high moment 1.2 T material such as cobalt iron alloy is preferable. The thickness of magnetic layer 82 is preferably between about 20 nm to about 300 nm, more preferably between about 120 nm to about 250 nm. Next nonmagnetic spacer layer 84 is plated on magnetic layer 82 (step 68). Spacer layer 84 can be tantalum (Ta), ruthenium (Ru), chromium (Cr), aluminum (Al), copper (Cu) or other nonmagnetic materials. The thickness of nonmagnetic spacer layer 84 is preferably between about 5 nm to about 100 nm, more preferably between about 25 nm to about 50 nm. Alternating deposition of magnetic layers and spacer layers is repeated until trench 78 is filled (step 70) as schematically illustrated in FIG. 4C. Following formation of the pole, resist 74 is removed and the structure is ready for further processing (step 72).

In another embodiment, a multilayer write pole with remanent easy axes parallel to both vertical direction L of the pole tip and the ABS is formed by physical vapor deposition (PVD). The steps to form write pole tip 16B by PVD are schematically listed in FIG. 5 and illustrated in FIGS. 6A and 6B. FIGS. 6A and 6B show schematic representations of cross-sections of pole tip 16B formed by this method. To form pole tip 16B, multilayer structure 100 of alternating layers of magnetic and nonmagnetic material is first formed. First, seedlayer 104 is deposited on wall 102 (step 90). Next, magnetic layer 106 is deposited on seedlayer 104 (step 91). Next, nonmagnetic spacer layer 108 is deposited on magnetic layer 106 (step 92). Steps 91 and 92 are repeated until multilayer structure 100 is of a size suitable to form a write pole and pole tip (step 93).

The example pole tip 20B, shown in FIG. 6B, is then formed by removing excess material from structure 100 outside dotted lines 101 and 103 as shown in FIG. 6A. Ion beam milling, reactive ion beam etching and other material removal methods can be used in step 94 of FIG. 5 to remove excess material 100.

Multilayer structure 100 can be formed by physical vapor deposition, ion beam deposition, magnetron sputtering and other deposition methods. Static off-axis deposition of multilayer structure 100 offers added enhancement. By controlling angle θ of the deposition flux, magnetic anisotropy can be induced in magnetic layers 106. Depending on the value of θ, magnetic anisotropy parallel to or perpendicular to the flux direction can occur that can be used to advantage to amplify the shape anisotropy direction imparted by the thin film layers. In various embodiments, the magnetic layer 106 is formed of cobalt iron (CoFe), cobalt nickel iron (CoNiFe), nickel iron (NiFe), cobalt (Co) or other magnetic material. A high moment 1.2 T cobalt-iron alloy is preferred. The thickness of magnetic layer 106 is preferably between about 20 nm to about 300 nm, more preferably between about 120 nm to about 250 nm microns. Spacer layer 108 can be tantalum (Ta), ruthenium (Ru), chromium (Cr), aluminum (Al), copper (Cu) or other nonmagnetic metals. The thickness of nonmagnetic spacer layer 108 is preferably between about 5 nm to about 100 nm, more preferably between about 25 nm to about 50 nm microns.

Figure 7:
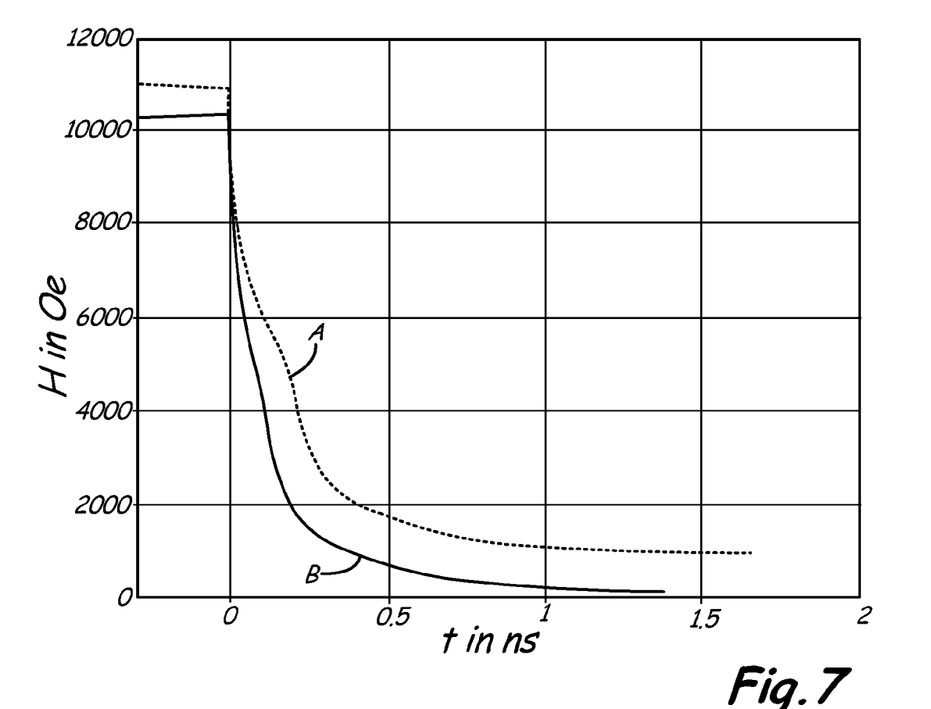
FIG. 7 is a plot showing magnetization as a function of time following cessation of drive current for a prior art write pole and an embodiment of a write pole of the present invention.

Write pole configuration A resembled pole 14A and pole tip 16A of FIG. 2A with remanent magnetization parallel to short transverse dimension W. Write pole configuration B resembled the inventive embodiment of write pole 14B and pole tip 16B shown in FIG. 2B with remanent magnetization parallel to vertical direction L. Both pole geometries were the same with write pole tip widths W of about 100 nm and pole tip heights H of about 150 nm. FIG. 7 shows the perpendicular fields for pole configurations A and B as a function of time after the driver current of the magnetic circuits is turned off. Both poles exceeded 1KOe at saturation. The laminated pole with remanent anisotropy parallel to vertical direction L (configuration B) first reached equilibrium in a shorter time and exhibited almost no remanent field. This leads to the conclusion that poles with vertical remanent anisotropy (configuration B) are superior to poles with short transverse anisotropy (configuration A).

Although the present disclosure has been described with reference to a number of embodiments, workers skilled in the art will recognize that changes may be made in form and detail without departing from the spirit and scope of the technology. The implementations described above and other implementations are within the scope of the following claims.

The invention claimed is:

1. A magnetic writer for writing data to a perpendicular magnetic storage medium comprising:
a write pole tip having a transverse width dimension W and a vertical length dimension L defining a plane parallel to an air bearing surface (ABS), the write pole tip having a height dimension H perpendicular to the ABS, the width dimension configured to be less than the length dimension, and the pole tip configured with a magnetic easy axis parallel to the length dimension and ABS and perpendicular to the height dimension.

2. The magnetic writer of claim 1, wherein the write pole tip comprises alternating layers of magnetic and nonmagnetic materials.

3. The magnetic writer of claim 2, wherein a planar orientation of the alternating layers is parallel to the vertical length dimension and to the height dimension of the write pole tip.

4. The magnetic writer of claim 2 wherein the magnetic layers comprise one of at least one of cobalt iron, cobalt nickel iron, nickel iron, and cobalt.

5. The magnetic writer of claim 2 wherein the nonmagnetic layers comprise at least one of tantalum, ruthenium, chromium, aluminum and copper.

6. The magnetic writer of claim 1 further comprising:
a write coil for inducing a write magnetic field in the write pole tip, the write magnetic field being oriented generally perpendicular the ABS.

7. A method of forming a write pole tip, the method comprising:
defining a shape of the write pole tip; and
depositing alternating magnetic layers and non-magnetic spacer layers, the magnetic layers oriented substantially parallel to a length dimension of the write pole tip and substantially perpendicular to an air bearing surface along a height dimension, at least one magnetic layer having an easy axis of magnetization substantially parallel to the length dimension and ABS and perpendicular to a height dimension of the write pole.

8. The method of claim 7 wherein defining a shape of the write pole tip comprises:
forming a resist layer on a substrate; and
forming a trench in the resist layer.

9. The method of claim 8 wherein depositing alternating magnetic layers and non-magnetic layers comprises:
depositing a seedlayer on the sides and bottom of the trench;
plating a layer of magnetic material on the seedlayer in the trench;
plating a layer of non-magnetic material on the magnetic material; and
repeating the process of plating magnetic and non-magnetic layers until the trench is filled.

10. The method of claim 9 wherein the seedlayer being deposited comprises at least one of tantalum, ruthenium, aluminum and copper.

11. The method of claim 9 wherein the magnetic layers being plated comprise at least one of cobalt iron, cobalt nickel iron, nickel iron, and cobalt.

12. The method of claim 9 wherein a planar orientation of the alternating layers being plated is parallel to the vertical length dimension L and to a height dimension H of the pole tip.

13. The method of claim 9 wherein the nonmagnetic layers being plated comprise at least one of nickel-phosphorus, ruthenium, aluminum and copper.

14. The method of claim 7 wherein depositing alternating magnetic layers and non-magnetic layers comprises:
depositing a seedlayer on a substrate wall;
depositing a magnetic layer on the seedlayer;
depositing a non-magnetic spacer layer on the magnetic layer; and
repeating the process of depositing magnetic and non-magnetic layers until a multilayer structure of a size suitable to form a write pole tip is deposited.

15. The method of claim 14 wherein defining a shape of the write pole tip comprises:

removing excess material from the multilayer structure to form the write pole tip.

16. The method of claim 14 wherein depositing alternating magnetic and nonmagnetic layers is by physical vapor deposition or sidewall electroplating.

17. The method of claim 16 wherein the physical vapor deposition comprises static off axis physical vapor deposition or sidewall electroplating.

18. The method of claim 14, wherein the magnetic layers being deposited comprise at least one of cobalt iron, cobalt nickel iron, nickel iron, and cobalt.

19. The method of claim 14, wherein the nonmagnetic layers being deposited comprise at least one of tantalum, ruthenium, aluminum and copper.

20. An apparatus comprising:
a write pole configured with leading and trailing edges connected by a pole sidewall on an air bearing surface (ABS), the write pole having a plurality of layers with at least one layer configured with a magnetic anisotropy easy axis parallel to the pole sidewall.

* * * * *

UNITED STATES PATENT AND TRADEMARK OFFICE
CERTIFICATE OF CORRECTION

PATENT NO. : 8,405,931 B2
APPLICATION NO. : 12/491898
DATED : March 26, 2013
INVENTOR(S) : Mark T. Kief et al.

Page 1 of 1

It is certified that error appears in the above-identified patent and that said Letters Patent is hereby corrected as shown below:

In the Claims:

In Col. 6, line 29
replace "write pole."
with "write pole tip."

Signed and Sealed this
Twenty-third Day of July, 2013

Teresa Stanek Rea
*Acting Director of the United States Patent and Trademark Office*